(12) United States Patent
Surthi et al.

(10) Patent No.: US 8,007,275 B2
(45) Date of Patent: Aug. 30, 2011

(54) METHODS AND APPARATUSES FOR HEATING SEMICONDUCTOR WAFERS

(75) Inventors: Shyam Surthi, Boise, ID (US); Scott E. Moore, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 670 days.

(21) Appl. No.: 12/020,158

(22) Filed: Jan. 25, 2008

(65) Prior Publication Data

US 2009/0191499 A1 Jul. 30, 2009

(51) Int. Cl.
*F27D 13/00* (2006.01)

(52) U.S. Cl. .............................. 432/5; 432/247; 438/795

(58) Field of Classification Search .............. 432/5, 241, 432/247; 414/935–939; 219/390, 405; 438/795, 438/799
See application file for complete search history.

(56) References Cited

U.S. PATENT DOCUMENTS

| | | | | |
|---|---|---|---|---|
| 5,000,682 A | * | 3/1991 | Heidt et al. .................... | 432/241 |
| 5,001,327 A | | 3/1991 | Hirasawa et al. | |
| 5,058,526 A | * | 10/1991 | Matsushita et al. ........... | 118/715 |
| 5,273,423 A | * | 12/1993 | Shiraiwa ........................ | 432/241 |
| 5,277,579 A | * | 1/1994 | Takanabe .......................... | 432/5 |
| 5,378,283 A | * | 1/1995 | Ushikawa ....................... | 118/719 |
| 5,387,265 A | | 2/1995 | Kazikazi et al. | |
| 5,388,944 A | * | 2/1995 | Takanabe et al. ............. | 414/217 |
| 5,447,294 A | * | 9/1995 | Sakata et al. ................... | 266/257 |
| 6,174,366 B1 | | 1/2001 | Ihantola | |
| 6,726,468 B2 | | 4/2004 | Ibrahim et al. | |
| 6,729,823 B2 | * | 5/2004 | Sakata et al. ................... | 414/217 |
| 6,852,601 B2 | | 2/2005 | Yoshida et al. | |
| 6,929,774 B2 | | 8/2005 | Morad et al. | |
| 7,033,168 B1 | | 4/2006 | Gupta et al. | |
| 7,056,806 B2 | | 6/2006 | Basceri et al. | |
| 7,179,334 B2 | | 2/2007 | Sakamoto et al. | |
| 2001/0017294 A1 | | 8/2001 | Aoki et al. | |
| 2002/0084261 A1 | | 7/2002 | Yamazaki | |

(Continued)

FOREIGN PATENT DOCUMENTS

JP 2001-153564 A 6/2001

(Continued)

OTHER PUBLICATIONS

Fan, Yong-Hui and Taiqing Qiu, "Analyses of Thermal Stress and Control Schemes for Fast Temperature Ramps of Batch Furnaces," IEEE Transactions on Semiconductor Manufacturing, vol. 10, No. 4, pp. 433-437, Nov. 1997.

(Continued)

*Primary Examiner* — Gregory A Wilson
(74) *Attorney, Agent, or Firm* — Perkins Coie LLP

(57) ABSTRACT

Methods and apparatuses for heat treatment of semiconductor wafers are disclosed herein. A method of heating a semiconductor wafer in accordance with one embodiment includes heating the wafer in a loading enclosure of a heat treatment system above an ambient temperature external to the loading enclosure. The method also includes moving the heated wafer from the loading enclosure into a processing enclosure of the heat treatment system. In particular embodiments, the method can further include heating a flow of purge gas above the ambient temperature and introducing the flow of heated purge gas into the loading enclosure while the wafer is in the loading enclosure. In still further embodiments, the method can include heating a flow of process gas to a processing temperature and introducing the heated flow of process gas into the processing enclosure while the wafer is in the processing enclosure.

23 Claims, 4 Drawing Sheets

U.S. PATENT DOCUMENTS

| | | |
|---|---|---|
| 2002/0096507 A1 | 7/2002 | Nishitani et al. |
| 2002/0182888 A1 | 12/2002 | Buchanan et al. |
| 2003/0106495 A1 | 6/2003 | Asano et al. |
| 2004/0022528 A1 | 2/2004 | Yoo et al. |
| 2004/0023517 A1 | 2/2004 | Yoo |
| 2004/0168638 A1* | 9/2004 | Ishii et al. .................. 118/724 |
| 2004/0175878 A1 | 9/2004 | Takagi |
| 2005/0016452 A1 | 1/2005 | Ryu et al. |
| 2005/0121145 A1 | 6/2005 | Du Bois et al. |
| 2006/0057800 A1 | 3/2006 | Doan et al. |
| 2006/0175304 A1* | 8/2006 | Hwang et al. ............ 219/121.43 |
| 2007/0128878 A1 | 6/2007 | Izumi et al. |
| 2007/0141812 A1 | 6/2007 | Zagwijn et al. |
| 2007/0151509 A1 | 7/2007 | Park et al. |
| 2007/0170088 A1 | 7/2007 | Shimura |

FOREIGN PATENT DOCUMENTS

JP      2006-46717 A     2/2006

OTHER PUBLICATIONS

Hasper, A. et al., "Advanced Manufacturing Equipment: A Vertical Batch Furnace for 300-mm Wafer Processing," IEEE Micro, vol. 19, Issue 5, pp. 34-43, Sep./Oct. 1999.

Koyo Thermo Systems Co. Ltd., Vertical Furnace Furnaces for 300mm Semiconductor Wafer Processing, retrieved from the Internet on Jul. 12, 2007, <http://crystec.com.kllvf5700e.htm>.

Yoo, W.S. et al., "Ultra-Shallow Implant Anneal Using Single Wafer Rapid Thermal Furnace," IEEE, Proceedings of the 14th International Conference on Ion Implantation Technology, pp. 87-90, Sep. 2002.

* cited by examiner

METHODS AND APPARATUSES FOR HEATING SEMICONDUCTOR WAFERS

TECHNICAL FIELD

The present disclosure relates generally to heating semiconductor wafers in a semiconductor heat treatment system.

BACKGROUND

Heat treatment systems are used for heating semiconductor wafers to a desired processing temperature for oxidation, diffusion, chemical vapor deposition ("CVD"), atomic layer deposition ("ALD") and/or other processes. During these processes, wafers are typically heated in a reaction furnace, either individually or in groups. To simultaneously heat multiple wafers, a batch of wafers is loaded into a wafer holder, such as a wafer boat, and the loaded wafer boat is inserted into the reaction furnace. The reaction furnace then heats the wafers and the wafer boat to the desired processing temperature. In addition to heating the wafers, certain heat treatment systems are also configured to process the wafers at a pressure below atmospheric pressure.

One challenge associated with heating the wafers in a heat treatment system is the amount of time required for the wafers to reach thermal equilibrium at the desired processing temperature. A conventional low temperature reaction furnace, for example, can take approximately one to two and a half hours to heat a typical batch of 300 mm wafers from room temperature (e.g., 25° C.) to a processing temperature of 75° C. A typical batch can include 150 wafers, and accordingly, one cause of the prolonged heating time is the substantial thermal mass of the batch of wafers combined with the wafer boat. One approach to expediting the heating time is to rapidly increase the heat transfer rate to the wafers. However, if the wafers are heated too quickly, the wafer temperature may overshoot the processing temperature, which extends the time required to stabilize the wafers at the processing temperature. In addition, overshooting the processing temperature can damage the wafer structure or materials as well as adversely affect the subsequent processing steps.

Another approach to addressing the foregoing challenge is to heat wafers individually. Heating wafers one at a time, however, will also not likely increase the speed of the overall process because loading, heating and removing individual wafers can take significantly more time than heating a batch of wafers. Accordingly, the amount of time required to heat a batch of wafers or a single wafer can significantly restrict the throughput of conventional heat treatment systems.

DETAILED DESCRIPTION

Figure 1:
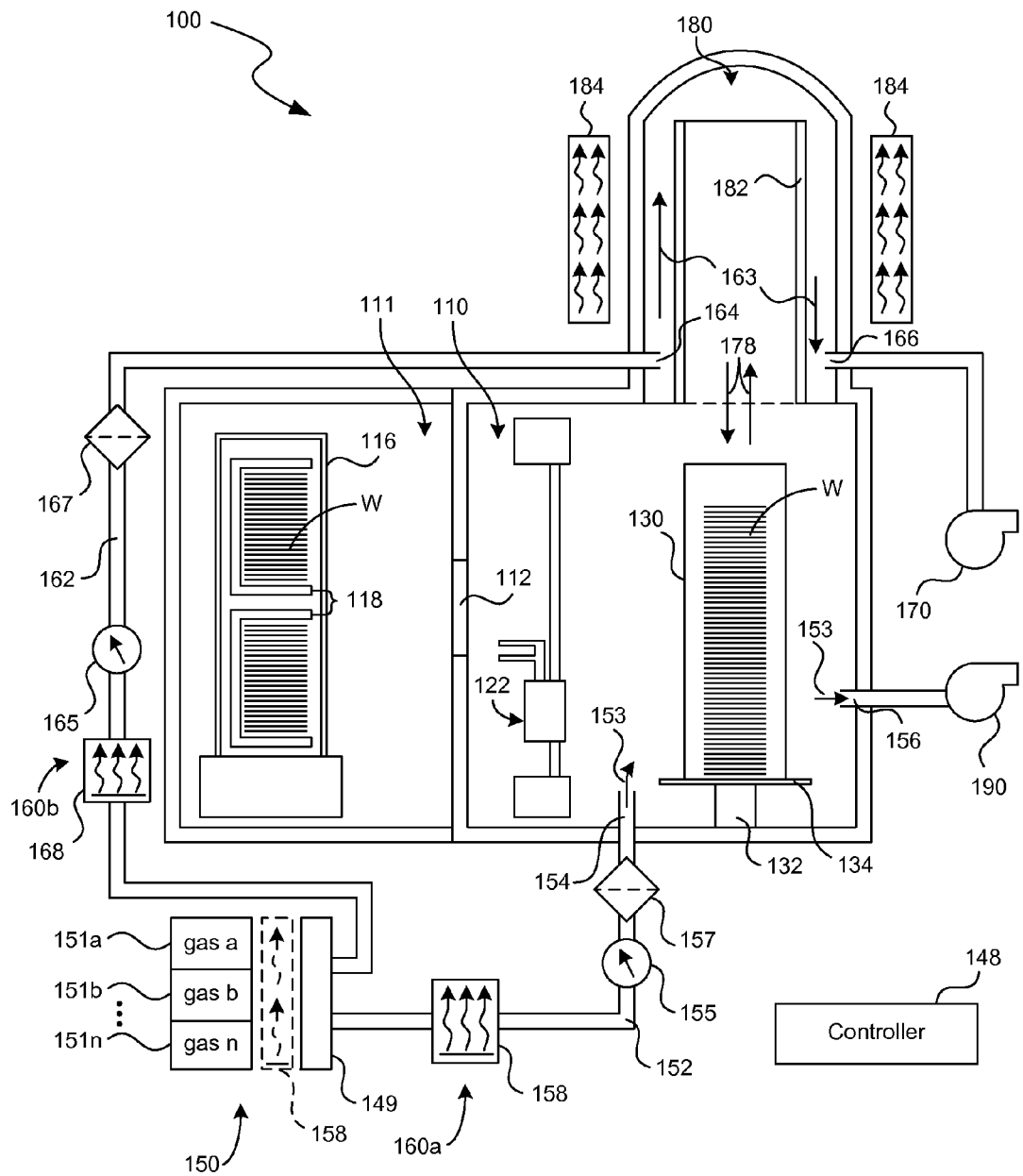
FIG. 1 is a schematic cross-sectional view of a semiconductor wafer heat treatment system configured in accordance with one embodiment of the disclosure.

Several embodiments of the present disclosure are directed to semiconductor heat treatment systems and methods for heating semiconductor wafers. Many details are described below with reference to these systems and methods. The term "semiconductor wafer" is used throughout the disclosure to include substrates upon which or in which microelectronic devices, micromechanical devices, data storage elements, read/write components and other features are fabricated. Semiconductor wafers can include, for example, silicon or gallium arsenide wafers, glass substrates, insulative substrates and substrates made from many other types of materials.

Certain details of several embodiments are set forth in FIGS. 1-4 and the following text to provide a thorough understanding of these embodiments. Like reference characters refer generally to like components in FIGS. 1-4, and thus the description of many of these components will not be repeated for all the Figures. In addition, several other embodiments can have components, configurations and/or processes different than those described in this section. Other details describing well-known structures and components associated with wafer heat treatment systems and methods have not been described below to avoid unnecessarily obscuring the description of the various embodiments herein. Accordingly, further embodiments can include elements in addition to those described below, and/or can eliminate several of the elements described below.

FIG. 1 is a schematic cross-sectional view of a heat treatment system 100 configured in accordance with a particular embodiment for processing one or more semiconductor wafers W. The system 100 includes a loading enclosure 110 and a processing enclosure 180, each of which is coupled to a gas supply 150. The loading enclosure 110 is coupled to an exhaust source 190, and the processing enclosure 180 is coupled to a vacuum source 170. The loading enclosure 110 is configured to receive and position the wafers W in the system 100 before moving them into the processing enclosure 180. In certain embodiments, the loading enclosure 110 includes a wafer storage area 111 housing a carrier 116. The carrier 116 can hold and move multiple support members 118 into and out of the wafer storage area 111. In other embodiments, however, the support members 118 can enter and exit the storage area 111 without the carrier 116. Individual support members 118 can hold a predetermined number (e.g., 1-25) of wafers W and can facilitate transporting the wafers W outside of the system 100. In certain embodiments, for example, the support members 118 can include wafer cassettes or "FOUPs" (forward opening unified pods). A controller 148 can be coupled among some or all components of the system 100 to control the operation of the components. In certain embodiments the controller 148 can be coupled to the components with wireless, wired, fiber optic and/or other links to control the operation of the system 100.

In the loading enclosure 110, a wafer transfer device 122 moves individual wafers W from the support members 118 to a wafer holder 130 and vice versa. A door 112 can provide access for the wafer transfer device 122 between the storage area 111 and the loading enclosure 110. The wafer transfer device 122 can move in various directions to transfer the wafers W into the wafer holder 130 in a stacked and spaced apart configuration. In certain embodiments, the wafer holder 130 can accommodate a plurality (e.g., 1-250) of wafers W in a configuration suitable for the processing enclosure 180. As will be appreciated by one of ordinary skill in the art, however, the illustrated wafer holder 130 is shown schematically and can be configured to hold any number of wafers W. Moreover, in certain embodiments, the system 100 can include two or more wafer holders 130 to enable wafers W in a first wafer holder to be processed while additional wafers W are simultaneously loaded into a second wafer holder.

As the wafers W are loaded into the wafer holder 130, at least one heated purge gas 153 flows through the loading enclosure 110. A purge gas line 152 can introduce the heated purge gas 153 from the gas source 150 into the loading enclosure 110 through a purge gas inlet 154. In certain embodiments, the purge gas line 152 can include a filter 157 (shown schematically) to prevent contaminants from entering the loading enclosure 110. Although the filter 157 is illustrated in-line with the purge gas line 152, in other embodiments the filter 157 can be positioned in the loading enclosure 110. The loading enclosure 110 can include a purge gas outlet 156 that is coupled to the exhaust source 190. Accordingly, the purge gas 153 can flow from the purge gas inlet 154, through the loading enclosure 110 and can exit through the purge gas outlet 156. The purge gas 153 can entrain and remove particulate matter and/or other contaminants in the loading enclosure 110, which could adversely affect the wafer W processing. Although only one purge gas line 152 is shown in FIG. 1, one skilled in the art will appreciate that the system 100 can include more than one purge gas line 152 to deliver the purge gas 153 into the loading enclosure 110.

In the embodiment illustrated in FIG. 1, the system 100 also includes at least one heat source, e.g., a first heat source 160a, to heat the purge gas 153 before it enters the loading enclosure 110. Accordingly, the purge gas 153 can at least partially heat the wafers W in the loading enclosure 110 above an ambient temperature external to the loading enclosure 110. As used herein, the ambient temperature refers generally to the temperature in the immediate area around the loading enclosure 110 and the processing enclosure 180. The first heat source 160a illustrated in FIG. 1 includes a purge gas heater 158 (shown schematically) positioned in-line with the purge gas line 152. In certain embodiments, the purge gas heater 158 can be a radiant heater positioned radially around a section of the purge gas line 152. In other embodiments, the purge gas heater 158 can include different configurations, such as for example, a resistive heating element. The purge gas heater 158 can heat the purge gas 153 over a limited portion of the purge gas line 152 (as shown in FIG. 1), or it can heat the entire purge gas line 152. The purge gas heater 158 can include a single unit (as shown in FIG. 1), or multiple units located upstream of the loading enclosure 110. In still further embodiments, the purge gas heater 158 (shown in broken lines) can be located at the gas supply 150 to heat the purge gas 153 before it enters the purge gas line 152.

A purge gas temperature sensor 155 (shown schematically) can provide inputs to the controller 148 to control the process of heating the purge gas 153. In certain embodiments, for example, the purge gas temperature sensor 155 can be an in-line sensor, such as a thermocouple, located downstream from the heat source. The temperature sensor 155 can therefore indicate if the purge gas 153 is heated to the desired temperature before reaching the loading enclosure 110. In other embodiments, the temperature sensor 155 can be located elsewhere in the system 100, for example, at the gas supply 150 or in the loading enclosure 110. In any of these embodiments, the controller 148 can provide a thermostat function, e.g., by directing activation of the heat source only if the purge gas 153 is below the desired temperature.

At least some aspects of the gas supply 150 will depend on the nature of the process carried out in the system 100. For example, in certain embodiments when moisture and/or oxygen content will not adversely affect the process, the purge gas 153 introduced into the loading enclosure 110 can be air from a clean room where the heat treatment system 100 is located. In other embodiments, the purge gas 153 can include an inert gas, such as nitrogen, or other suitable purging gases. The gas supply 150 can accordingly include a plurality of separate gas sources 151a-n to provide the purge gas, processing gases and other gases used in the loading enclosure 110 and the processing enclosure 180. The gas supply 150 can also include a valve assembly 149 to selectively deliver the purge gas and process gases to the loading enclosure 110 and the processing enclosure 180, respectively.

After a predetermined number of wafers W are transferred into the wafer holder 130, an elevator 132 or other transfer device moves the wafer holder 130 into a reaction furnace 182 in the processing enclosure 180. The wafer holder 130 accordingly moves along a motion path indicated by arrows 178 between the loading enclosure 110 and the processing enclosure 180. A base portion 134 associated with the wafer holder 130 can seal the entry opening of the processing enclosure 180 when the wafer holder 130 is inside. In the embodiment illustrated in FIG. 1, a reaction furnace heater 184 (shown schematically) heats the reaction furnace 182 to the predetermined processing temperature. In certain embodiments, the furnace heater 184 can be arranged about a circumference of the processing enclosure 180. In other embodiments, the furnace heater 184 can have different configurations, including for example, an internally located heater core.

While moving the wafer holder 130 into the reaction furnace 182 and during the wafer processing, heated process gases 163 can flow through the processing enclosure 180. As used herein, the process gas 163 can include a purge gas, precursor gas, reaction gas, deposition gas and/or any other gas that is delivered to the processing enclosure 180. Multiple process gases 163 can be sequentially provided to the enclosure. For example, a heated purge gas can remove contaminants from the processing area 180 as the wafers W move into the reaction furnace 182. Afterwards, a precursor gas and a reaction gas can be sequentially directed into the processing enclosure 180. A process gas line 162 introduces the one or more process gases 163 into the processing enclosure 180 through a process gas inlet 164. The process gas line 162 can also include a filter 167 (shown schematically) to prevent contaminants from entering the processing enclosure 180. The processing enclosure 180 can include a process gas outlet 166 that is coupled to the vacuum source 170, and accordingly the process gases 163 can flow through the processing enclosure 180 and exit through the outlet 166. Although only one process gas line 162 is shown in FIG. 1, one skilled in the art will appreciate that the system 100 can include more than one process gas line 162 to deliver different process gases 163 to the processing enclosure 180.

The illustrated system 100 can also include a second heat source 160b positioned to heat the process gases 163 before they enter the processing enclosure 180. Accordingly, the process gases 163 can heat the wafers W in the reaction furnace 182, or maintain the wafers W at the desired processing temperature. The embodiment illustrated in FIG. 1 includes a process gas heater 168 and a process gas temperature sensor 165 (both of which are shown schematically) in the process gas line 162. The process gas heater 168 can be located in the process gas line 162 or at the gas supply 150 in a manner generally similar to that described above with reference to the purge gas heater 158. The process gas temperature sensor 165 can also be generally similar to the purge gas temperature sensor 155 described above. One skilled in the art will appreciate, however, that a single heat source and a single temperature sensor can be configured to heat both the purge and process gases that are introduced into the loading enclosure 110 and processing enclosure 180, respectively. For example, a heat source and a temperature sensor positioned in the gas supply 150 can control the heating of the purge gas 153 and the process gases 163, before they flow through the gas lines.

After the wafers W have been processed in the reaction furnace 182, the elevator 132 lowers the wafer holder 130 into the loading enclosure 110. The wafer transfer device 122 moves the wafers W back to the support members 118, and the carrier 116 can remove the loaded support members 118 from the loading enclosure 110 of the heat treatment system 100.

Figure 2:
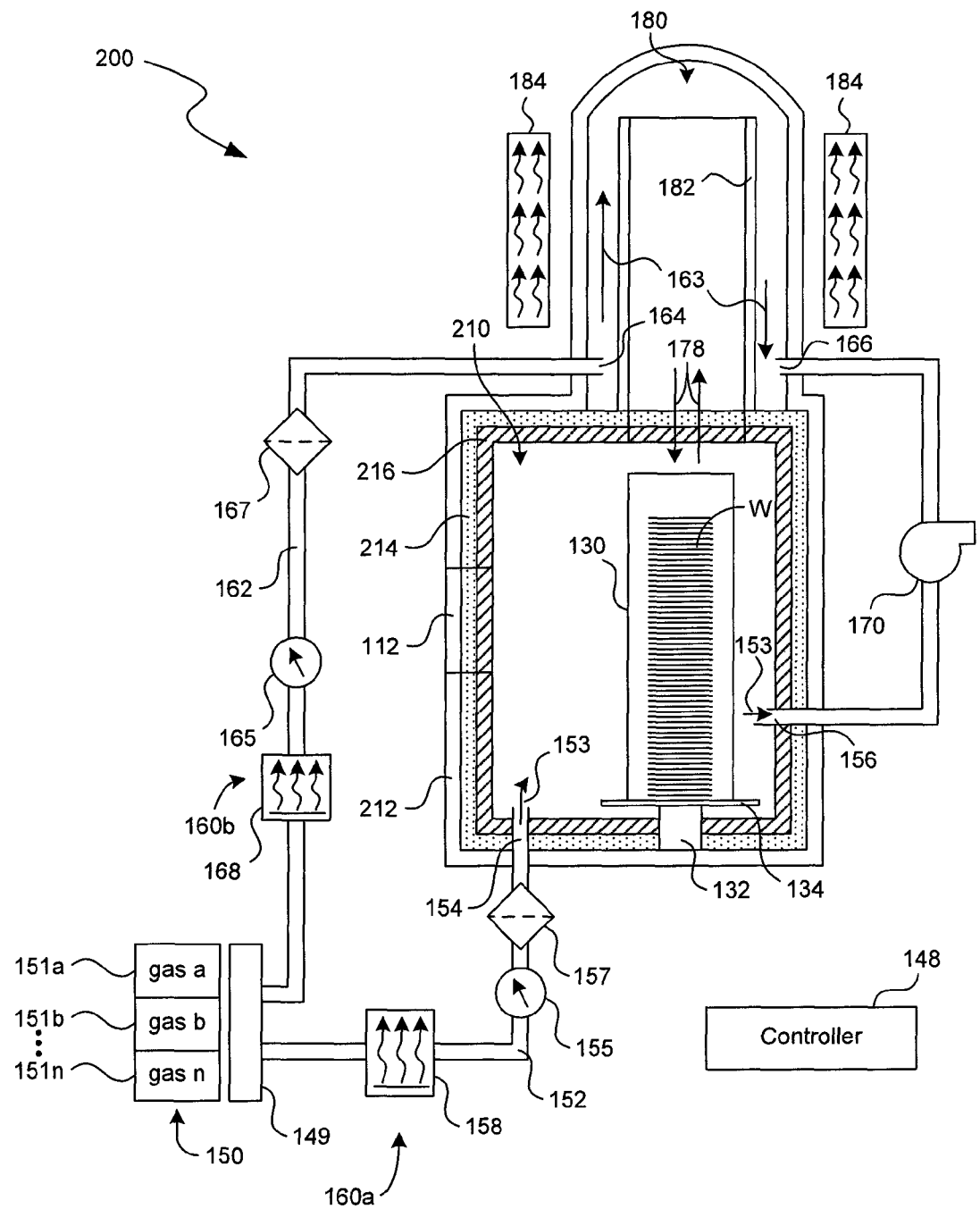
FIG. 2 is a schematic cross-sectional view of a semiconductor wafer heat treatment system configured in accordance with another embodiment of the disclosure.

FIG. 2 is a schematic cross-sectional view of a heat treatment system 200 configured in accordance with another embodiment for processing one or more semiconductor wafers W at a pressure reduced below atmospheric pressure. Certain features of the system 200 illustrated in FIG. 2 can be generally similar to those of the heat treatment system 100 described above. For example, the system 200 can include a wafer holder 130 and a door 112 to provide access to the wafer holder 130 in a manner generally similar to that described above with reference to FIG. 1. The illustrated system 200 can also include a first heat source 160a to heat a purge gas 153, and a second heat source 160b to heat one or more process gases 163.

The illustrated system 200 can further include a sub-atmospheric loading enclosure 210 that is configured to pump down to a pressure below atmospheric pressure before the wafers W are transferred into the processing enclosure 180. In the illustrated embodiment, the processing enclosure 180 can accordingly be configured to be a sub-atmospheric enclosure for the wafer W processing. In certain embodiments, for example, the loading enclosure 210 can include a load lock configured to cycle between atmospheric and reduced pressures. Accordingly, the purge gas 153 can flow through the loading enclosure 210 as the wafer holder 130 is loaded, and can be stopped after the wafer holder 130 is loaded. At this point, the vacuum source 170, which is coupled to the loading enclosure 210 in the illustrated embodiment, can be activated to reduce the pressure in the loading enclosure 210 to be approximately equal to a reduced processing pressure in the processing enclosure 180. Accordingly, the furnace 182 can remain at a low pressure and the loading enclosure 210 can cycle between atmospheric and less than atmospheric pressures. This arrangement can at least partially decrease the stresses on the reaction furnace 182 and the processing enclosure 180.

The system 200 can at least partially heat the wafers W with the heated purge gas 153, while the wafers W are loaded into the wafer holder 130, in a manner generally similar to that described above with reference to FIG. 1. In the embodiment illustrated in FIG. 2, however, the loading enclosure 210 also includes a heating element in thermal communication with the interior of the loading enclosure 210. More specifically, the loading enclosure 210 can include a wall 212 having an insulation layer 214 and a heating element 216 positioned proximate to the interior of the wall 212. In certain embodiments, the wall 212 can be composed of a solid metal so that it will not leak when the pressure is reduced. The heating element 216 is configured to heat the wafers W above the ambient external temperature while the pressure is reduced in the loading enclosure 210. The heating element 216 can accordingly include a radiative heater, such as resistive heating element, or another device suitable for heating the interior of the loading enclosure 210. In particular embodiments, the heating element 216 can line the interior of the loading enclosure wall 212, or it can be selectively positioned inside the enclosure wall 212 to heat the wafers W. The insulation layer 214 can retain the heat within the loading enclosure 210 and can at least partially prevent an exterior surface of the loading enclosure 210 from heating.

Figure 3:
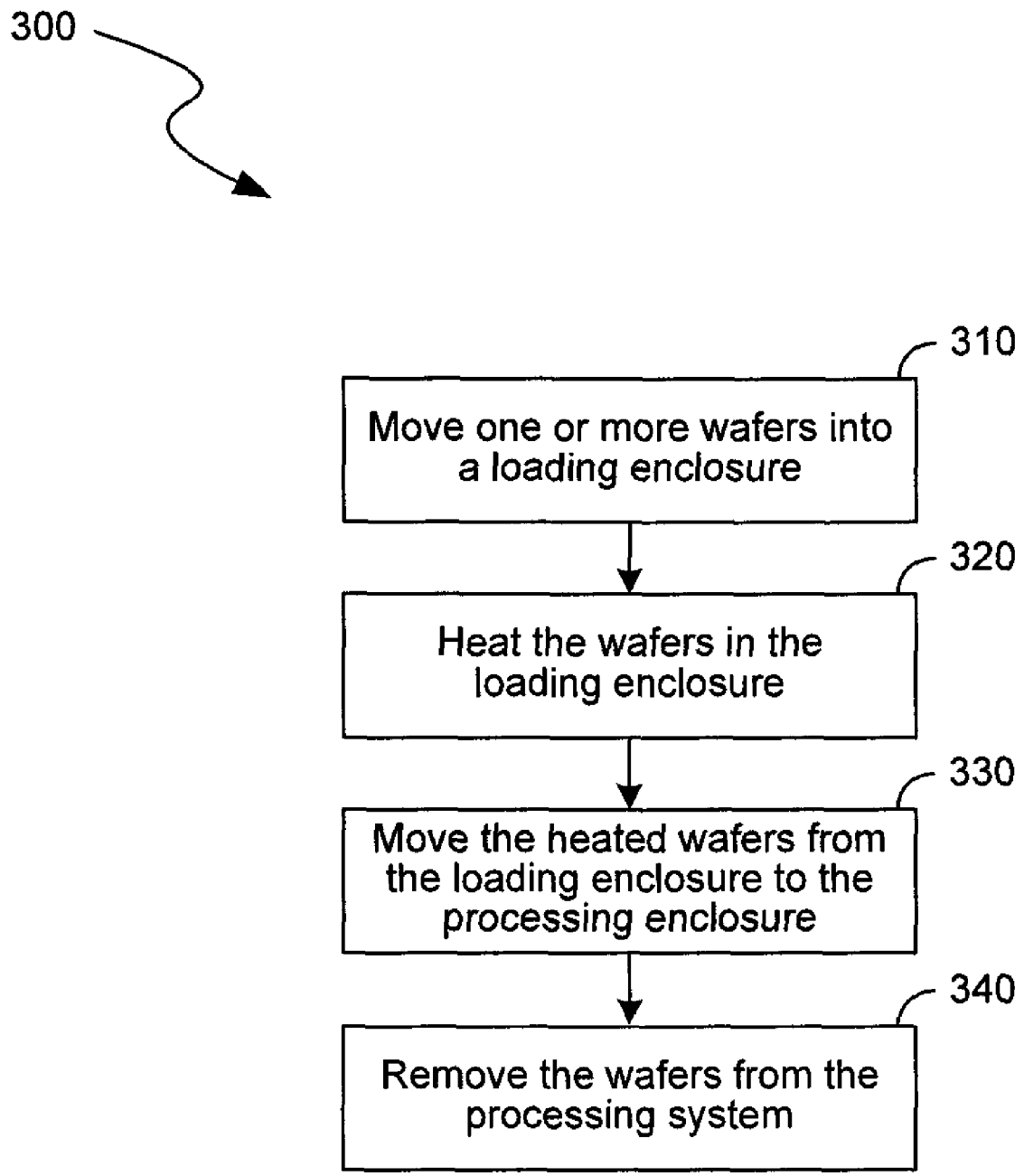
FIG. 3 is a schematic flow diagram illustrating aspects of a process for heating a semiconductor wafer configured in accordance with an embodiment of the disclosure.

FIG. 3 is a flow diagram illustrating a process 300 for heating and processing at least one semiconductor wafer in accordance with an embodiment of the disclosure. The process 300 can include moving one or more wafers into a loading enclosure of a heat treatment system (block 310). In a particular embodiment, moving the wafers into the loading enclosure includes loading the wafers into a wafer holder in preparation for processing. Moving and loading the wafers may take a significant amount of time (e.g., 10-30 minutes), depending on the number of wafers and the configuration of the wafer holder. As the wafers enter the loading enclosure, they will typically be at a temperature approximately equal to an ambient temperature external to the loading enclosure. The wafers, for example, may be at room temperature (e.g., 25° C.) when they are moved into the loading enclosure.

The process 300 can further include heating the wafers in the loading enclosure above the ambient temperature external to the loading enclosure (block 320). In this portion of the process, the wafers can be heated while they are being loaded into the wafer holder and before the wafer holder is moved into a processing enclosure. In certain embodiments, heating the wafers in the loading enclosure includes heating purge gas and introducing the purge gas into the loading enclosure. Accordingly, the purge gas can heat the wafers by convection. The temperature of the purge gas can be controlled to have a predetermined value relative to a processing temperature of the downstream processing enclosure. In certain embodiments, for example, the purge gas can be heated to a temperature that is equal to or greater than the processing temperature. In other embodiments, the purge gas can be heated to a predetermined percentage of the processing temperature (e.g., approximately 70%). In still further embodiments, the purge gas can be heated to at least 70° C. or in the range of 70° C.-125° C. In still further embodiments, the purge gas can be heated to temperatures above 125° C. During this stage in the processing, the ambient air as well as the purge gas in the loading enclosure is withdrawn with the exhaust source as the purge gas is introduced into the loading enclosure. Accordingly, during the time that it takes to load the wafers into the wafer holder, the heated purge gas is replenished so as to heat the wafers above the ambient external temperature and remove contaminants or other materials from the wafers and/or the loading enclosure. In certain embodiments, the heating via the purge can continue as the wafer holder is moved into the processing enclosure.

Heating the wafers W in the loading enclosure can increase the throughput of the heat treatment system by reducing the heating time in the processing enclosure. For example, moving the wafers into a reaction furnace in the processing enclosure at a temperature higher than the ambient external temperature (e.g., room temperature) can reduce the amount of time required to heat the wafers in the reaction furnace. Preheating the wafers in this manner can also reduce the likelihood of overshooting the processing temperature of the wafers, which can in turn reduce the likelihood of damaging the wafers. In addition, preheating the wafers in the loading enclosure can also more efficiently utilize the time that the wafers are in the loading enclosure, as the wafers are sequentially loaded into the wafer holder. For example, each wafer loaded into the wafer holder remains in the loading enclosure for a period of time until the wafer holder is full and/or otherwise ready to be moved into the processing enclosure, and during this time, the wafers can be heated with the purge gas.

After loading and heating the wafers in the loading enclosure, the process 300 can further include moving the heated wafers from the loading enclosure to the processing enclosure (block 330). In embodiments where the wafers have not been heated to the processing temperature in the loading enclosure, the wafers can be further heated in the processing enclosure to the processing temperature. In certain embodiments, heating the wafers in the processing enclosure includes heating and directing the flow of one or more heated process gases (e.g., purge, deposition, reaction, and/or other gases) into the reaction furnace, in addition to providing heat via a reaction furnace heater. The temperature of the heated process gases can be controlled to have a predetermined value relative to the processing temperature. In certain embodiments, for example, the process gases can be heated to a temperature equal to or greater than the processing temperature. The heated process gases can accordingly heat the wafers when they are moved into the processing enclosure, thus supplementing the reaction furnace heater to decrease the amount of time required to heat the wafers to the processing temperature in the processing enclosure.

After heating and processing the wafers, the process 300 can further include removing the wafers from the heat treatment system (block 340). For example, the loaded wafer holder can be moved from the reaction furnace to the loading enclosure. Individual wafers can be removed from the wafer holder in the loading enclosure, thus clearing the loading enclosure for the next batch of wafers. The process 300 can then be repeated.

Figure 4:
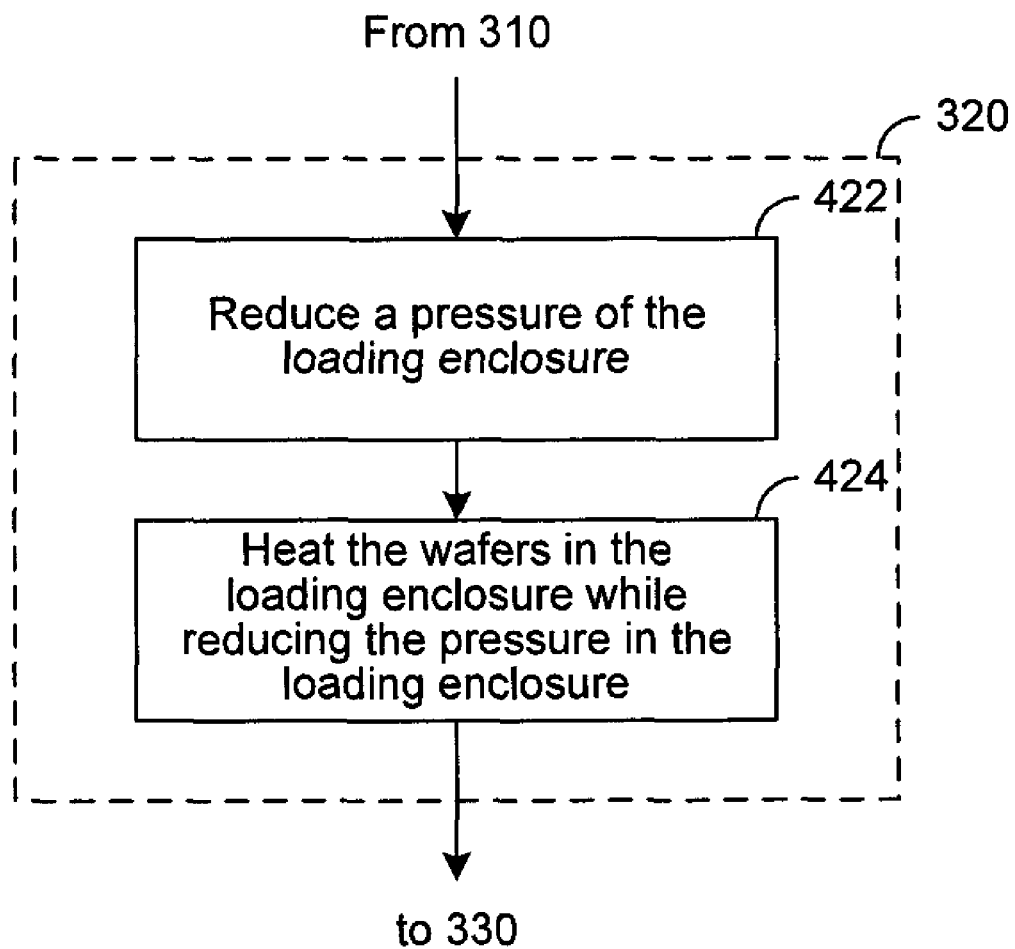
FIG. 4 is a schematic flow diagram illustrating aspects of another embodiment of the wafer heating step of FIG. 3.

FIG. 4 is a flow diagram illustrating the wafer heating process (block 320) of FIG. 3 according to another embodiment in which the wafers are processed at a pressure below atmospheric pressure. In this embodiment, the pressure of the loading enclosure is reduced to be approximately equal to a reduced processing pressure after loading one or more wafers in the wafer holder (block 422). In a particular aspect of this embodiment, the purge gas can heat the wafers as the wafers are loaded into the wafer holder. The purge gas can heat the wafers (e.g., by convection) above the external ambient temperature as explained above with reference to FIG. 3. After the wafer holder is loaded, the vacuum source can reduce the pressure in the loading enclosure.

The process can further include heating the wafers in the loading enclosure while reducing the pressure in the loading enclosure (block 424). As the vacuum source removes the gas from the loading enclosure, heating the wafers in the loading enclosure can include activating a heating element in the interior of the loading enclosure. The heating element can accordingly heat the wafers (e.g., by radiation) to a temperature above the external ambient temperature. Heating the wafers while reducing the pressure in the loading enclosure can also increase the throughput of the heat treatment process. For example, during the time that it takes to reduce the pressure in the loading enclosure, the heating element can heat the wafers above the ambient external temperature to reduce the amount of time required to heat the wafers in the reaction furnace.

From the foregoing it will be appreciated that specific embodiments have been described herein for purposes of illustration, but that various modifications may be made without deviating from the disclosure. For example, the systems disclosed herein can be configured for processing a single wafer or simultaneously processing a batch of wafers. Other heat sources (e.g., heat lamps) can be used to heat the wafers in the loading enclosure. Certain features described in the context of particular embodiments may be combined or eliminated in other embodiments. For example, the same heated purge gas may be used to heat the wafers in the loading enclosure and the processing enclosure. Further, although advantages associated with certain embodiments have been described in the context of those embodiments, other embodiments may also exhibit such advantages, and not all embodiments need necessarily exhibit such advantages to fall within the scope of the disclosure. Accordingly, the invention is not limited except as by the appended claims.

We claim:

1. A method of heating a semiconductor wafer, comprising:
heating the wafer in a loading enclosure of a heat treatment system to a temperature above an ambient temperature external to the loading enclosure;
heating a flow of purge gas in a purge gas line to a temperature above the ambient temperature with an in-line purge gas heater;
sensing the temperature of the heated flow of purge gas in the purge gas line;
introducing the flow of heated purge gas into the loading enclosure to heat the wafer above the ambient temperature;
moving the heated wafer from the loading enclosure into a processing enclosure of the heat treatment system;
heating a flow of process gas in a process gas line to a processing temperature with an in line process gas heater; and
introducing the flow of heated process gas into the processing enclosure.

2. A method of heating a semiconductor wafer, comprising:
heating the wafer in a loading enclosure of a heat treatment system to a temperature above an ambient temperature external to the loading enclosure; wherein heating the wafer includes heating a flow of purge gas above the ambient temperature and introducing the flow of heated purge gas into the loading enclosure while the wafer is in the loading enclosure; and
moving the heated wafer from the loading enclosure into a processing enclosure of the heat treatment system.

3. The method of claim 2 wherein heating the flow of purge gas includes heating the flow of purge gas to a temperature in the range of 70-125° C.

4. The method of claim 2 wherein heating the flow of purge gas includes heating the flow of purge gas to a temperature having a predetermined value relative to a processing temperature of the processing enclosure.

5. The method of claim 2, further comprising removing the purge gas and contaminants entrained in the purge gas from the loading enclosure.

6. The method of claim 2, further comprising:
moving the wafer into the loading enclosure while the wafer is carried by a support member; and
transferring the wafer from the support member to a wafer holder in the loading enclosure with a transfer device.

7. The method of claim 2 wherein the wafer is a first wafer, and the method further comprises simultaneously heating a plurality of wafers in the loading enclosure to the temperature above the ambient temperature, and simultaneously moving the plurality of heated wafers from the loading enclosure into the processing enclosure.

8. The method of claim 2 wherein introducing the flow of heated purge gas includes introducing a flow of heated air into the loading enclosure.

9. The method of claim 2 wherein introducing the flow of heated purge gas includes introducing a flow of heated nitrogen into the loading enclosure.

10. A method of heating a semiconductor wafer, comprising:
heating the wafer in a loading enclosure of a heat treatment system to a temperature above an ambient temperature external to the loading enclosure; wherein heating the wafer includes heating a flow of purge gas above the ambient temperature and introducing the flow of heated purge gas into the loading enclosure while the wafer is in the loading enclosure;
moving the heated wafer from the loading enclosure into a processing enclosure of the heat treatment system;
heating the wafer in the processing enclosure to a predetermined processing temperature by heating a flow of at least one process gas to a temperature equal to or greater than the processing temperature, and
introducing the flow of heated process gas into the processing enclosure while the wafer is in the processing enclosure.

11. The method of claim 10 wherein the at least one process gas includes one or more of a processing area purge gas, precursor gas, reaction gas and deposition gas.

12. A method of heating a semiconductor wafer, comprising:
moving the wafer at a first temperature into a loading enclosure of a heat treatment system;
heating the wafer to a second temperature greater than the first temperature while the wafer is in the loading enclosure, wherein heating the wafer includes introducing a heated purge gas at or above the second temperature into the loading enclosure while the wafer is in the loading enclosure;
reducing a pressure in the loading enclosure to be below atmospheric pressure; and
moving the wafer from the loading enclosure to a processing enclosure having a processing pressure reduced below atmospheric pressure.

13. The method of claim 12 wherein heating the wafer includes activating a heating element in the loading enclosure while reducing the pressure of the loading enclosure.

14. The method of claim 12 wherein reducing the pressure in the loading enclosure includes reducing the pressure to be equal to the processing pressure.

15. A heat treatment system for semiconductor wafers, comprising:
a loading enclosure positioned to receive at least one wafer at a first temperature;
a processing enclosure positioned proximate to the loading enclosure, the processing enclosure being heatable to a second temperature higher than the first temperature;
a wafer motion path between the loading enclosure and the processing enclosure;
a purge gas supply coupled to the loading enclosure to introduce a purge gas into the loading enclosure at a third temperature higher than the first temperature;
a purge gas line connecting the purge gas supply to the loading enclosure;
a purge gas heat source positioned in-line with the purge gas line;
a thermal sensor positioned in-line with the purge gas line downstream from the purge gas heat source; and
a controller operably coupled to the thermal sensor and the purge gas heat source and programmed with instructions to control the heating of the purge gas to be at the third temperature.

16. A heat treatment system for semiconductor wafers, comprising:
a loading enclosure positioned to receive at least one wafer at a first temperature;
a processing enclosure positioned proximate to the loading enclosure, the processing enclosure being heatable to a second temperature higher than the first temperature;
a wafer motion path between the loading enclosure and the processing enclosure;
a purge gas supply coupled to the loading enclosure to introduce a purge gas into the loading enclosure at a third temperature higher than the first temperature;
a purge gas line connecting the purge gas supply to the loading enclosure; and
a heat source coupled to the purge gas supply to heat the purge gas to or above the third temperature in the purge gas supply before the purge gas is introduced into the purge gas line.

17. The system of claim 16, further comprising an evacuation source coupled to the loading enclosure to remove the purge gas and contaminants entrained in the purge gas from the loading enclosure.

18. The system of claim 16, further comprising a process gas supply coupled to the processing enclosure to introduce one or more process gases into the processing enclosure at or above the second temperature.

19. The system of claim 18, further comprising:
a process gas line connecting the process gas supply to the processing enclosure; and
a heat source coupled to the process gas line to heat the process gases to at least the second temperature in the process gas line before the process gases are introduced into the processing enclosure.

20. The heat treatment system of claim 16 wherein:
the loading enclosure is a sub-atmospheric loading enclosure having a wafer holder positioned to carry the wafer; and
the processing enclosure is a sub-atmospheric processing enclosure; the system further comprising:
a vacuum source coupled to the loading enclosure to reduce a pressure of the loading enclosure to a processing pressure below atmospheric pressure; and
a heating element positioned in thermal communication with an interior of the loading enclosure.

21. The system of claim 20 wherein the heating element is positioned within the loading enclosure, and wherein the system further comprises an insulation layer between the heating element and an exterior of the loading enclosure.

22. The system of claim 20, further comprising a heater coupled between the purge gas supply and the loading enclosure.

23. The system of claim 20 wherein the heating element includes a radiative heating element.

* * * * *